(12) United States Patent
Lo

(10) Patent No.: US 9,576,933 B1
(45) Date of Patent: Feb. 21, 2017

(54) FAN-OUT WAFER LEVEL PACKAGING AND MANUFACTURING METHOD THEREOF

(71) Applicant: INOTERA MEMORIES, INC., Taoyuan (TW)

(72) Inventor: Yi-Jen Lo, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/989,782

(22) Filed: Jan. 6, 2016

(51) Int. Cl.
| H01L 23/48 | (2006.01) |
| H01L 25/065 | (2006.01) |
| H01L 23/31 | (2006.01) |
| H01L 23/485 | (2006.01) |
| H01L 23/00 | (2006.01) |
| H01L 49/02 | (2006.01) |

(52) U.S. Cl.
CPC ....... *H01L 25/0655* (2013.01); *H01L 23/3171* (2013.01); *H01L 23/3192* (2013.01); *H01L 23/481* (2013.01); *H01L 23/485* (2013.01); *H01L 24/08* (2013.01); *H01L 24/14* (2013.01); *H01L 28/75* (2013.01); *H01L 2224/02331* (2013.01); *H01L 2224/0401* (2013.01); *H01L 2224/04105* (2013.01); *H01L 2224/05147* (2013.01)

(58) Field of Classification Search
CPC .......... H01L 24/08; H01L 24/14; H01L 28/75; H01L 2224/02331; H01L 2224/0401; H01L 2224/04105; H01L 2224/05147; H01L 25/0655; H01L 23/3171; H01L 23/3192; H01L 23/485; H01L 23/481
USPC .................................................. 257/704, 692
See application file for complete search history.

(56) References Cited

U.S. PATENT DOCUMENTS

| 6,770,955 B1* | 8/2004 | Coccioli ............. H01L 23/3128 257/659 |
| 2007/0289127 A1* | 12/2007 | Hurwitz .............. H01L 21/4857 29/827 |
| 2009/0294899 A1* | 12/2009 | Pagaila ............... H01L 21/6835 257/528 |
| 2010/0327419 A1* | 12/2010 | Muthukumar ...... H01L 23/3121 257/686 |
| 2011/0133331 A1* | 6/2011 | Lin .................... H01L 23/53228 257/737 |
| 2015/0228632 A1* | 8/2015 | Yu .......................... H01L 24/18 257/704 |
| 2015/0294939 A1* | 10/2015 | Yu .......................... H01L 25/50 257/529 |
| 2016/0172402 A1* | 6/2016 | Katkar ............... H01L 27/1464 257/292 |

* cited by examiner

*Primary Examiner* — Vongsavanh Sengdara
(74) *Attorney, Agent, or Firm* — Winston Hsu; Scott Margo

(57) ABSTRACT

A fan-out wafer-level-package (FOWLP) is provided. The FOWLP includes a redistribution layer (RDL) comprising a dielectric layer and a first metal layer; a passive device in the first metal layer; a first passivation layer covering a top surface of the RDL; a second passivation layer covering a bottom surface of the RDL; a chip mounted on the first passivation layer; a molding compound around the chip and on the first passivation layer; a via opening penetrating through the second passivation layer, the dielectric layer, and the second passivation layer, thereby exposing a terminal of the chip; a contact opening in the second passivation layer; and a second metal layer in the via opening and the contact opening to electrically connect one electrode of the passive device with the terminal of the chip.

11 Claims, 9 Drawing Sheets

FAN-OUT WAFER LEVEL PACKAGING AND MANUFACTURING METHOD THEREOF

BACKGROUND OF THE INVENTION

1. Field of the Invention

The present invention relates generally to the field of semiconductor packaging, and more particularly to fan-out wafer level packaging (FOWLP) and manufacturing method thereof.

2. Description of the Prior Art

With recent advancements in the semiconductor manufacturing technology microelectronic components are becoming smaller and circuitry within such components is becoming increasingly dense. To reduce the dimensions of such components, the structures by which these components are packages and assembled with circuit boards must become more compact.

As known in the art, embedded wafer ball grid array (eWLB) or fan-out wafer-level packaging (FOWLP) is a packaging process in which contacts of a semiconductor die are redistributed over a larger area through a redistribution layer (RDL) that is typically formed on a substrate such as a TSV interposer.

The RDL is typically defined by the addition of metal and dielectric layers onto the surface of the wafer to re-route the I/O layout into a looser pitch footprint. Such redistribution requires thin film polymers such as BCB, PI or other organic polymers and metallization such as Al or Cu to reroute the peripheral pads to an area array configuration.

The TSV interposer is costly because fabricating the interposer substrate with TSVs is a complex process. Thus, forming FOWLP products that includes an interposer having a TSV interposer may be undesirable for certain applications.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious especially in a large sized wafer, and has raised an obstacle to a wafer level semiconductor packaging process. Therefore, there remains a need in the art for an improved method of manufacturing wafer level packages.

SUMMARY OF THE INVENTION

The present invention is directed to provide an improved semiconductor device and fabrication method thereof.

According to one aspect of the invention, a fan-out wafer-level-package (FOWLP) is provided. The FOWLP includes a redistribution layer (RDL) comprising at least one dielectric layer and at least one first metal layer; a passive device in the first metal layer of the RDL; a first passivation layer covering a top surface of the RDL; a second passivation layer covering a bottom surface of the RDL; at least one chip mounted on the first passivation layer, wherein the chip comprises a terminal in direct contact with the first passivation layer; a molding compound disposed around the chip and on the first passivation layer; a via opening penetrating through the second passivation layer, the dielectric layer, and the second passivation layer, thereby exposing a portion of the terminal; a contact opening in the second passivation layer, thereby exposing a portion of one electrode of the passive device; and a second metal layer in the via opening and the contact opening to electrically connect the electrode of the passive device with the terminal of the chip.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
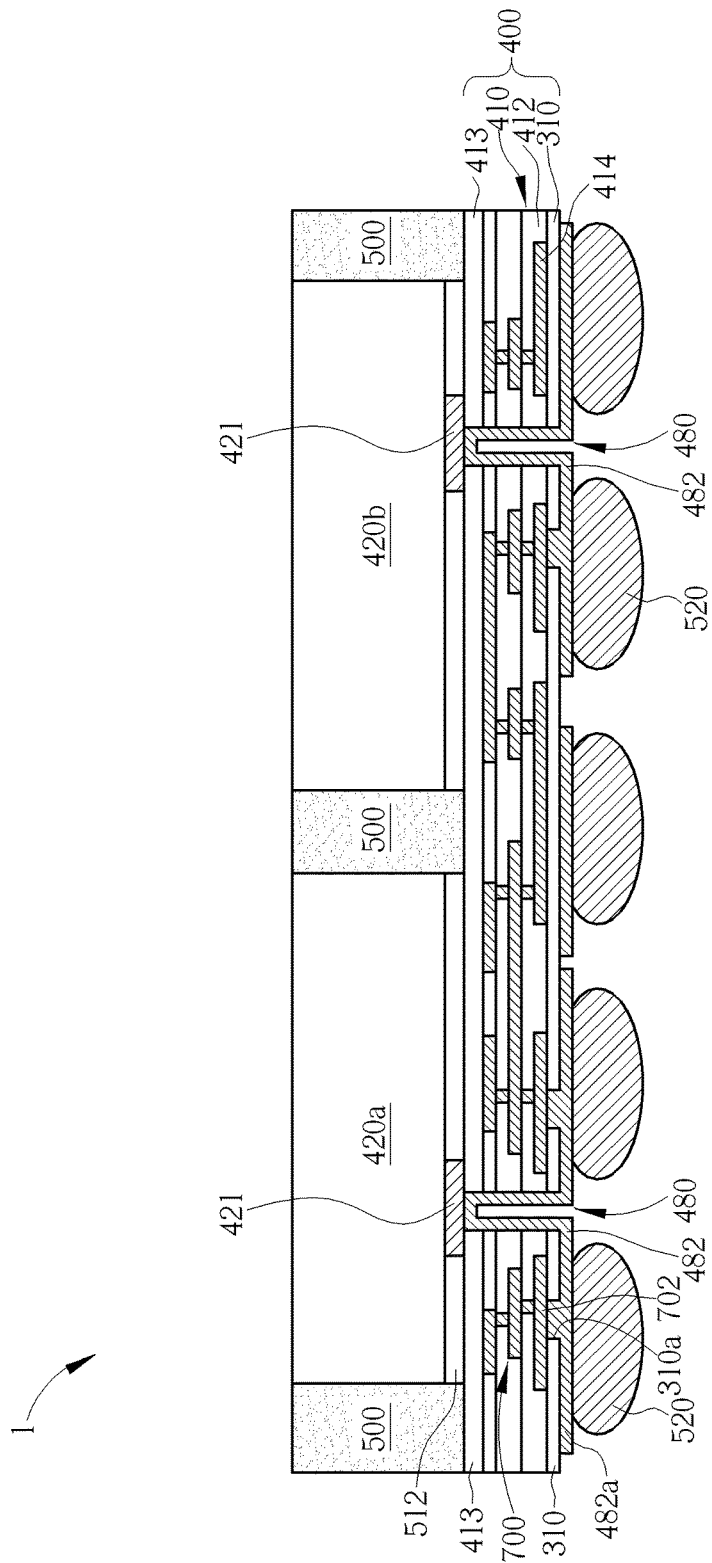
FIG. 1 is a schematic, cross-sectional diagram showing an exemplary fan-out wafer level packaging (FOWLP) according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1. FIG. 1 is a schematic, cross-sectional diagram showing an exemplary fan-out wafer level packaging (FOWLP) according to one embodiment of the invention. As shown in FIG. 1, the FOWLP 1 comprises a redistribution layer (RDL) 410. The RDL 410 may comprise at least one dielectric layer 412 and at least one metal layer 414. The dielectric layer 412 may comprise inorganic materials such as silicon nitride, silicon oxide or the like, but is not limited thereto. The metal layer 414 may comprise aluminum, copper, tungsten, titanium, titanium nitride, or the like. It is to be understood that the metal layer 414 may comprise multi-layer metal traces and the dielectric layer 412 may comprise multi-layer dielectric laminate.

According to the embodiment of the invention, the FOWLP 1 may further comprise at least one passive device 700 such as a metal-insulator-metal (MIM) capacitor, which is fabricated in the RDL 410. According to the embodiment of the invention, the passive device 700 is embedded in the dielectric layer 412.

A passivation layer 413 (or an adhesive layer) is laminated on a top surface of the RDL 410. The passivation layer 413 is indirect contact with the dielectric layer 412 of the RDL 410 and covers a portion of the metal layer 414. For example, the passivation layer 413 may comprise polymer such as benzocyclobutene (BCB), but not limited thereto. According to the embodiment of the invention, the passivation layer 413 is subjected to a curing process after chip attachment. The passivation layer 413 comprising polymer such as BCB may be partially cured (e.g., 60-80% degree of cure).

The FOWLP 1 further comprises individual flip-chips or dies 420a and 420b with their active sides facing down toward the RDL 410. The dies 420a and 420b are mounted on the passivation layer 413. The dies 420a and 420b comprise terminals 421 including, but not limited to, metal bumps on the input/output (I/O) pads distributed on their flipped active surfaces. For the sake of simplicity, only one terminal 421 is shown on the active surface of each die.

Optionally, an inter-layer dielectric (ILD) 512 may be applied under each chip 420a/420b. The ILD 512 may be applied between the chip 420a/420b and the passivation layer 413 and may surround the terminal 421.

A molding compound 500 covers the attached chips 420a and 420b and the top surface of the passivation layer 413. The molding compound 500 may be subjected to a curing process. The molding compound 500 may comprise a mixture of epoxy and silica fillers, but not limited thereto.

A passivation layer 310 is laminated on a bottom surface of the RDL 410. The passivation layer 413 is in direct contact with the dielectric layer 412 of the RDL 410 and covers a portion of the metal layer 414. The passivation layer 310 may comprise organic materials such as polyimide (PI) or inorganic materials such as silicon nitride, silicon oxide or the like. The RDL 410, the passivation layers 310 and 413 may function as an interposer (or an interposer substrate) 400.

The FOWLP 1 further comprises through-interposer-vias 480 in the passivation layer 310, the dielectric layer 412, and the passivation layer 413. The through-interposer-vias 480 penetrate the entire thickness of the interposer 400 including the passivation layer 310, the dielectric layer 412, and the passivation layer 413. The through-interposer-vias 480 are aligned with the terminals 421, respectively.

The through-interposer-vias 480 are metalized by a metal layer 482. For example, the metal layer 482 may be a copper layer formed by electroplating process or sputter plating process, but not limited thereto. The metal layer 482 may be conformally deposited on the interior surfaces of the through-interposer-vias 480 and may comprise a solder pad 482a on the passivation layer 310.

A contact opening 310a may be formed in the passivation layer 310 to expose an electrode 702 of the passive device 700. The metal layer 482 may fill into the contact opening 310a to electrically connect to the electrode 702 of the passive device 700. Solder balls 520 may be formed on the solder pad 482a of the metal layer 482 for further connection, for example, to a mother board or a printed circuit board. The metal layers 482 and 414 and the metalized through-interposer-vias 480 constitute inter-chip connection between the chip 420a and chip 420b.

It is noteworthy that according to the embodiment of the invention, no micro-bumps are required to be formed on the RDL 410. That is, the chips 420a and 420b are not electrically connected to the RDL 410 through conventional micro-bumps. The chips 420a and 420b are electrically connected to the RDL 410 and/or the passive device 700 through the metalized through-interposer-vias 480 and the metal layer 482. By eliminating the mirco-bumps, the total thickness of the FOWLP may be reduced.

Please refer to FIG. 2 to FIG. 9. FIG. 2 to FIG. 9 are schematic diagrams showing an exemplary method for fabricating a wafer level package (WLP) according to one embodiment of the invention.

Figure 2:
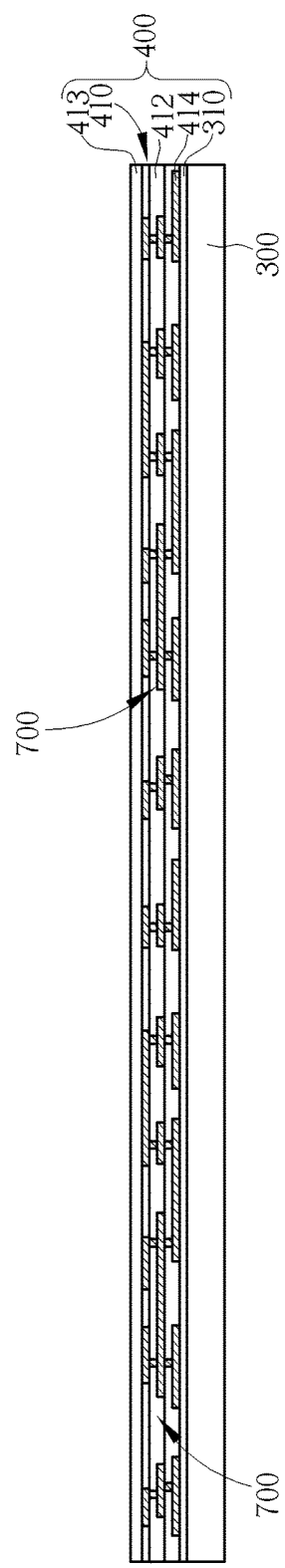
FIG. 2 to FIG. 9 are schematic, cross-sectional diagrams showing an exemplary method for fabricating the exemplary fan-out wafer level packaging in FIG. 1 according to one embodiment of the invention.

As shown in FIG. 2, a carrier 300 is prepared. The carrier 300 may be a wafer or substrate material with an adhesive layer (not explicitly shown), but not limited thereto. For example, the carrier 300 may comprise a glass substrate or a silicon substrate. At least a dielectric layer or a passivation layer 310 is then formed on a top surface of the carrier 300. The passivation layer 310 may comprise organic materials such as polyimide (PI) or inorganic materials such as silicon nitride, silicon oxide or the like.

Subsequently, a redistribution layer (RDL) 410 is formed on the passivation layer 310. The RDL 410 may comprise at least one dielectric layer 412 and at least one metal layer 414. The dielectric layer 412 may comprise inorganic materials such as silicon nitride, silicon oxide or the like, but not limited thereto.

The metal layer 414 may comprise aluminum, copper, tungsten, titanium, titanium nitride, or the like. The RDL 410 may comprise at least one passive device 700 such as a metal-insulator-metal (MIM) capacitor. The passive device 700 is embedded in the dielectric layer 412.

A passivation layer 413 is laminated on a top surface of the RDL 410. The passivation layer 413 is in direct contact with the dielectric layer 412 of the RDL 410 and covers a portion of the metal layer 414. For example, the passivation layer 413 may comprise polymer such as benzocyclobutene (BCB), but not limited thereto. According to the embodiment of the invention, the passivation layer 413 is subjected to a curing process after chip attachment. The passivation layer 413 comprising polymer such as BCB may be partially cured (e.g., 60-80% degree of cure). The RDL 410, the passivation layers 310 and 413 may function as an interposer (or an interposer substrate) 400.

Figure 3:
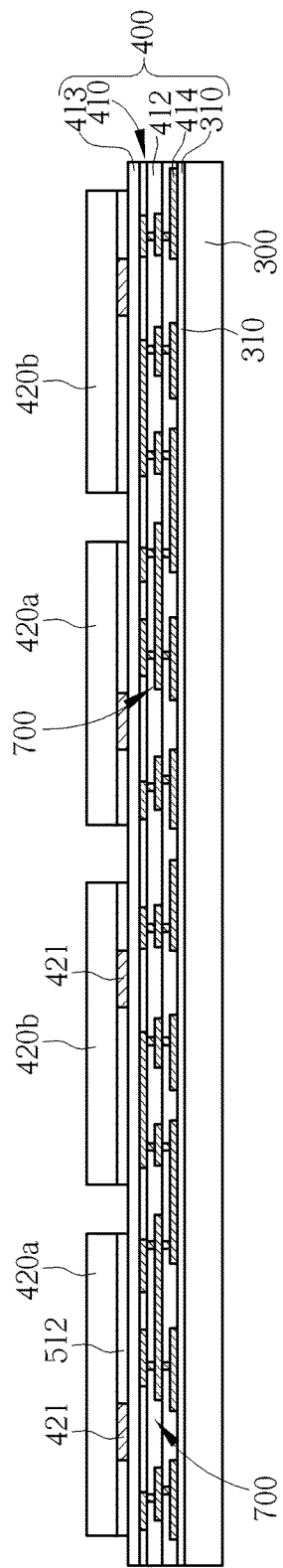

As shown in FIG. 3, subsequently, individual flip-chips or dies 420a and 420b with their active sides facing down toward the RDL 410 are then mounted on the passivation layer 413 to thereby forming a stacked chip-to-wafer (C2W) construction. The dies 420a and 420b comprise terminals 421 including, but not limited to, metal bumps on the input/output (I/O) pads distributed on their flipped active surfaces.

For the sake of simplicity, only one terminal 421 is shown on the active surface of each die. At this point, the terminals 421 are in direct contact and covered with the passivation layer 413.

Optionally, an inter-layer dielectric (ILD) 512 may be applied under each chip 420a/420b. The ILD 512 may be applied between the chip 420a/420b and the passivation layer 413 and may surround the terminal 421.

Figure 4:
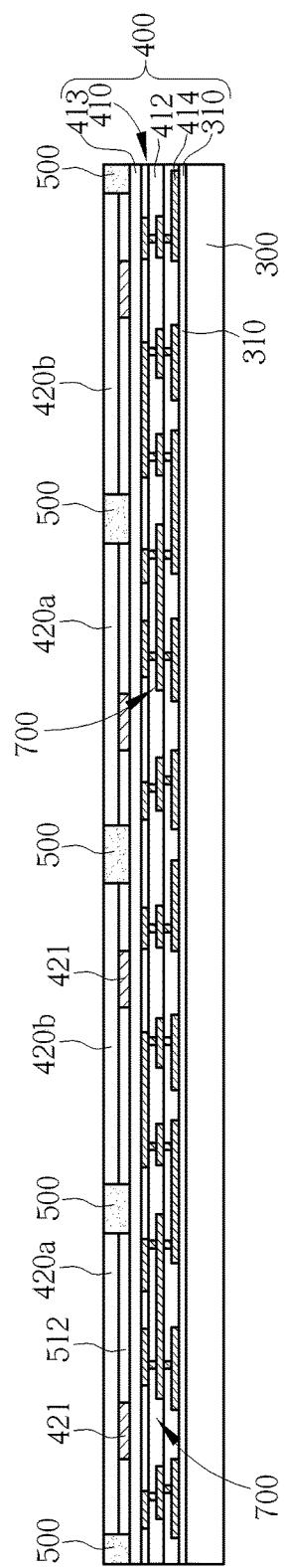

As shown in FIG. 4, after the chip-bonding process, a molding compound 500 is applied. The molding compound 500 covers the attached dies 420a and 420b and the top surface of the passivation layer 413. The molding compound 500 may be subjected to a curing process. The molding compound 500 may comprise a mixture of epoxy and silica fillers, but is not limited thereto. The top surface of the molding compound 500 may be then subjected to a grinding process to thereby remove an upper portion of the molding compound 500.

At this point, according to the embodiment, the top surfaces of the dies 420a and 420b are flush with the top surface of the molding compound 500. Optionally, an upper portion of each of the dies 420a and 420b may be removed during the grinding process.

Figure 5:
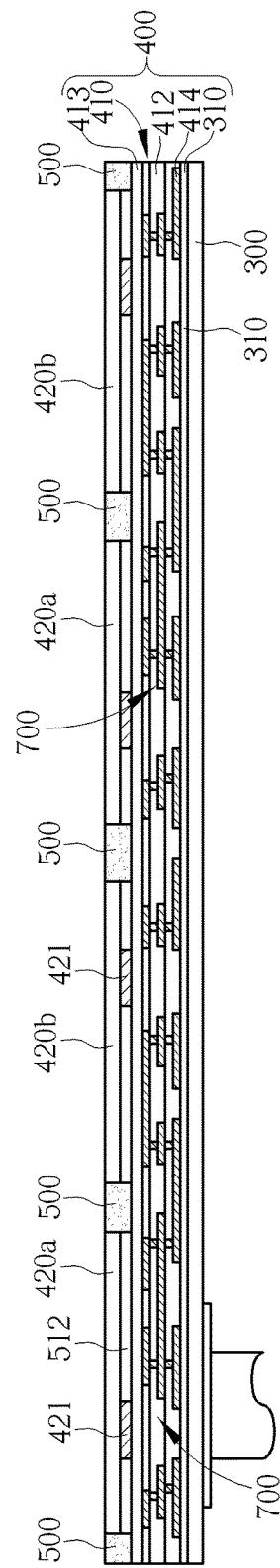

As shown in FIG. 5, another grinding process such as a chemical mechanical polishing (CMP) is performed to polish away the carrier 300 until the passivation layer 310 is revealed. It is to be understood that other methods may be employed to remove the carrier 300.

Figure 6:
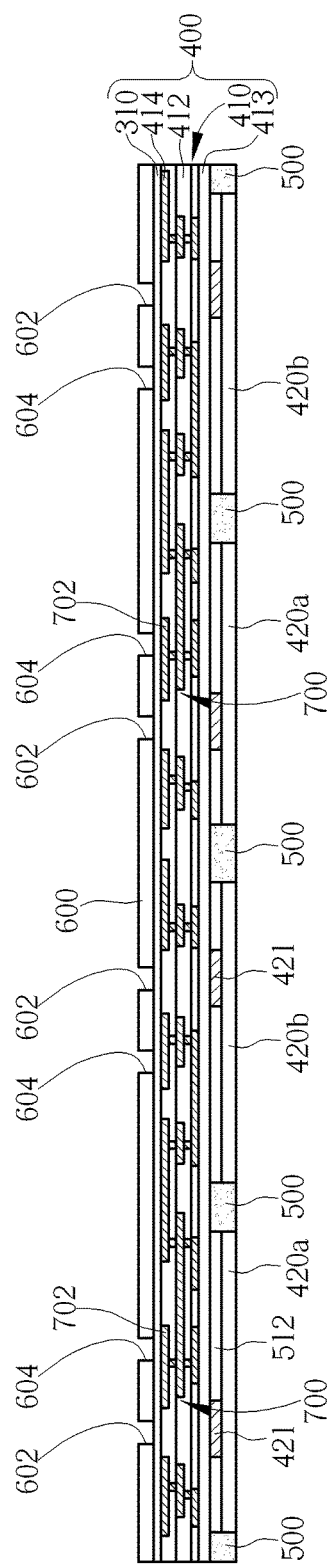

As shown in FIG. 6, a photoresist pattern 600 is formed on the passivation layer 310. The photoresist pattern 600 comprises a first opening 602 that defines the pattern and location of a through-interposer-via to be formed in the interposer 400, and a second opening 604 that defines the pattern and location of a contact hole for exposing an electrode of the passive device 700.

Figure 7:
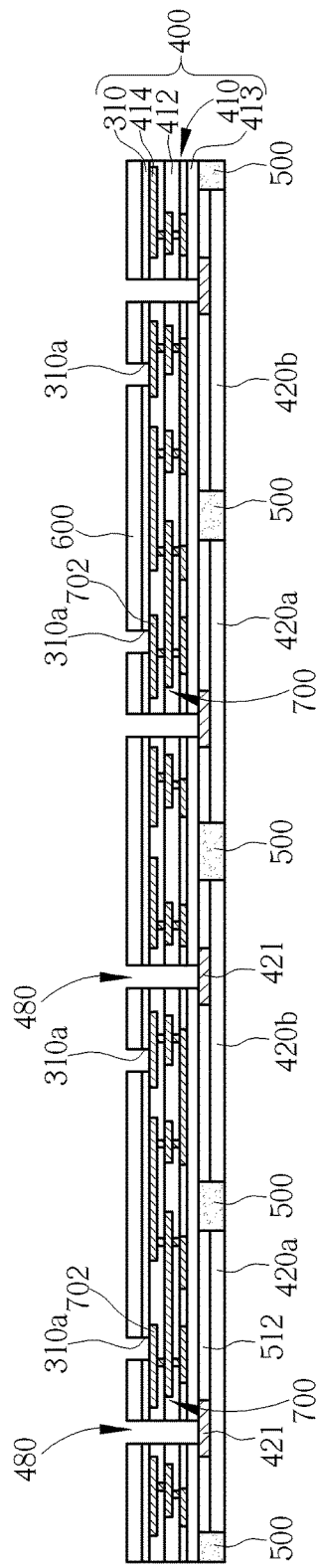

As shown in FIG. 7, an anisotropic dry etching process is then performed to etch the interposer 400 thereby forming at least one through-interposer-via 480 in the passivation layer 310, the dielectric layer 412, and the passivation layer 413, and at least one contact opening 310a in the passivation layer 310. The through-interposer-via 480 penetrates the entire thickness of the passivation layer 310, the entire thickness of the dielectric layer 412, and the entire thickness of the passivation layer 413. The through-interposer-via 480 is aligned with the terminal 421, and exposes a portion of the terminal 421. The contact opening 310a exposes a portion of the electrode 702 of the passive device 700.

The process as described above may be referred to as a "via-last" process since the through-interposer-via 480 is formed after the formation of the interposer 400, the die or chip bonding process, and the molding process according to one embodiment of the invention.

Figure 8:
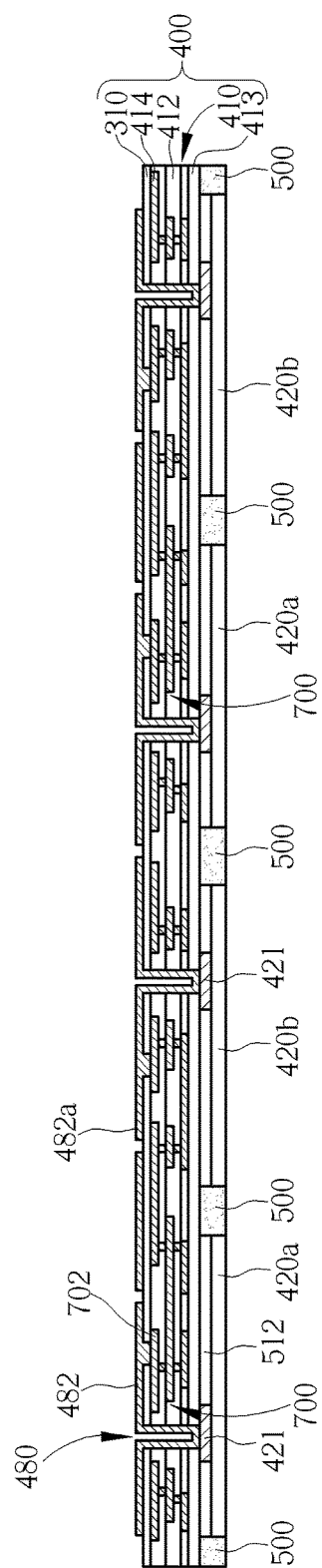

As shown in FIG. 8, a plating process, for example, a sputter plating process, is then performed to metalize the through-interposer-via 480 and the contact opening 310a. During the plating process, a metal layer 482 such as a copper layer is conformally deposited on the interior surface of the through-interposer-via 480 and may fill up the contact opening 310a so as to electrically connect the terminal 421 with the electrode 702 of the passive device 700. The metal layer 482 may also comprise a solder pad 482a on the passivation layer 310.

Figure 9:
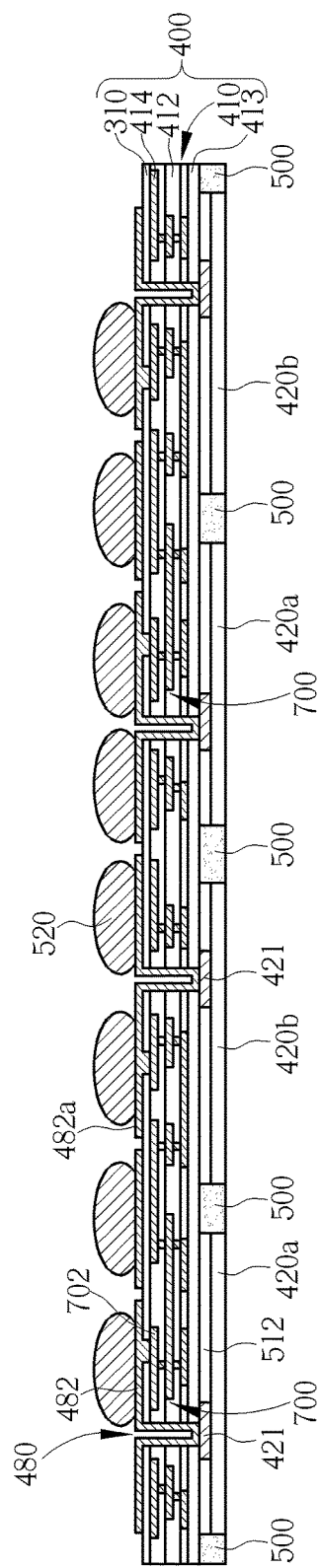

As shown in FIG. 9, solder balls 520 may be formed on the a solder pad 482a of the metal layer 482 for further connection, for example, to a motherboard or a printed circuit board. The metal layers 482 and 414 and the metalized through-interposer-vias 480 constitute inter-chip connection between the chip 420a and chip 420b. The wafer level package is then diced and singulated into individual die package.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fan-out wafer-level-package, comprising:
    a redistribution layer (RDL) comprising at least one dielectric layer and at least one first metal layer;
    a passive device in the first metal layer of the RDL;
    a first passivation layer covering a top surface of the RDL;
    a second passivation layer covering a bottom surface of the RDL;
    at least one chip mounted on the first passivation layer, wherein the chip comprises a terminal distributed directly on an active surface of the chip in direct contact with the first passivation layer;
    a molding compound disposed around the chip and on the first passivation layer;
    a via opening penetrating through the first passivation layer, the dielectric layer, and the second passivation layer, thereby exposing a portion of the terminal;
    a contact opening in the second passivation layer, thereby exposing a portion of one electrode of the passive device; and
    a second metal layer disposed on a lower surface of the second passivation layer wherein the via opening and the contact opening are filled with the second metal layer to electrically connect the electrode of the passive device with the terminal of the chip.

2. The fan-out wafer-level-package according to claim 1, wherein the dielectric layer comprises inorganic material.

3. The fan-out wafer-level-package according to claim 2, wherein the inorganic material comprises silicon nitride or silicon oxide.

4. The fan-out wafer-level-package according to claim 1, wherein the passive device comprises a metal-insulator-metal (MIM) capacitor.

5. The fan-out wafer-level-package according to claim 1, wherein the first passivation layer comprises benzocyclobutene (BCB).

6. The fan-out wafer-level-package according to claim 1, wherein the first metal layer comprises aluminum, copper, tungsten, titanium, or titanium nitride.

7. The fan-out wafer-level-package according to claim 1, wherein the second metal layer comprises copper.

8. The fan-out wafer-level-package according to claim 1, wherein the second metal layer further comprises a solder pad on the second passivation layer.

9. The fan-out wafer-level-package according to claim 8 further comprising a solder ball on the solder pad.

10. The fan-out wafer-level-package according to claim 1, wherein the terminal comprises a metal bump on an input/output (I/O) pad on the active surface of the chip.

11. The fan-out wafer-level-package according to claim 1, wherein the RDL, the first passivation layer, and the second passivation layer function as an interposer.

* * * * *